United States Patent
Pham et al.

(10) Patent No.: US 8,704,203 B2
(45) Date of Patent: Apr. 22, 2014

(54) TRANSITION METAL OXIDE BILAYERS

(71) Applicants: Intermolecular Inc., San Jose, CA (US); Kabushiki Kaisha Toshiba, Tokyo (JP); SanDisk 3D LLC, Milpitas, CA (US)

(72) Inventors: Hieu Pham, Santa Clara, CA (US); Vidyut Gopal, Sunnyvale, CA (US); Imran Hashim, Saratoga, CA (US); Tim Minvielle, San Jose, CA (US); Yun Wang, San Jose, CA (US); Takeshi Yamaguchi, Kanagawa (JP); Hong Sheng Yang, Pleasanton, CA (US)

(73) Assignees: Intermolecular, Inc., San Jose, CA (US); Kabushiki Kaisha Toshiba, Tokyo (JP); Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 13/971,467

(22) Filed: Aug. 20, 2013

(65) Prior Publication Data
US 2013/0334490 A1 Dec. 19, 2013

Related U.S. Application Data

(63) Continuation of application No. 13/367,927, filed on Feb. 7, 2012, now Pat. No. 8,569,104.

(51) Int. Cl.
*H01L 29/02* (2006.01)

(52) U.S. Cl.
USPC ..... 257/2; 257/3; 257/4; 257/5; 257/E29.002; 438/102; 438/103; 438/104

(58) Field of Classification Search
USPC ................... 257/2–5, E29.002; 438/102–104
See application file for complete search history.

(56) References Cited

U.S. PATENT DOCUMENTS

2007/0107774 A1* 5/2007 Jin et al. .................. 136/258

* cited by examiner

*Primary Examiner* — Jami M Valentine

(57) ABSTRACT

Embodiments of the invention include nonvolatile memory elements and memory devices comprising the nonvolatile memory elements. Methods for forming the nonvolatile memory elements are also disclosed. The nonvolatile memory element comprises a first electrode layer, a second electrode layer, and a plurality of layers of an oxide disposed between the first and second electrode layers. One of the oxide layers has linear resistance and substoichiometric composition, and the other oxide layer has bistable resistance and near-stoichiometric composition. Preferably, the sum of the two oxide layer thicknesses is between about 20 Å and about 100 Å, and the oxide layer with bistable resistance has a thickness between about 25% and about 75% of the total thickness. In one embodiment, the oxide layers are formed using reactive sputtering in an atmosphere with controlled flows of argon and oxygen.

20 Claims, 13 Drawing Sheets

TRANSITION METAL OXIDE BILAYERS

CROSS-REFERENCE TO RELATED APPLICATIONS

This application is a continuation and claims priority to U.S. patent application Ser. No. 13/367,927, filed 7 Feb. 2012, which is entirely incorporated by reference herein for all purposes.

FIELD OF THE INVENTION

One or more embodiments of the present invention relate to methods and apparatuses for depositing multiple layers of transition metal oxides of both stoichiometric and non-stoichiometric composition and any thickness.

BACKGROUND

Resistive random access memory (ReRAM) technologies are being proposed as a replacement for many semiconductor memory applications. These technologies can potentially enable the manufacture of non-volatile memories that are higher density, lower power, and faster access than technologies now in use.

ReRAM comprises arrays of non-volatile memory elements each of which in turn comprise a volume of material that exhibits bistable resistance. The resistance state can be repeatedly switched back and forth between high and low values using modest write/erase voltages and power levels, and the resistance state can be read with lower voltage levels that do not change the state. Bistable resistance is typically created in a layer of material that normally functions as an insulator at typical operating voltages. Filamentary conduction paths can be formed through sufficiently thin layers by aligning chains of defects which persist after forming. Typically, there is a one-time forming step requiring a relatively high voltage and current. Thereafter, the filamentary conduction paths can be reformed ("set") and broken ("reset") at one set of voltage and current levels and read (without changing state) at a much lower voltage and current.

Bistable resistance has been demonstrated in near-stoichiometric thin layers of many transition metal oxides including oxides of tantalum, niobium, hafnium, aluminum, titanium, and lanthanum among others. The conduction paths in these oxides are formed by aligning defects in the form of oxygen atoms vacancies. By using layers having a thickness of less than about 100 Å, conductive filaments can be formed through an otherwise insulative material using modest set voltages. Moreover, these filaments can be reformed and broken using appropriate set and rest voltages. Detailed understanding and precise control of the formation of these conductive filaments remains an area of active research at this time. Improved device characteristics can be made both with precise control over the material stoichiometry and by additional dopants that can facilitate the reversible alignment of defects in very thin layers.

Memory arrays based on ReRAM memory cells can be made as simple cross-bar structures wherein a layer of bistable resistive material is sandwiched between crossed parallel electrodes. Actual memory architectures must work with the available voltages from supporting read/write/erase circuitry, and it is often advantageous to add a current-limiting resistor at each memory element location. These current-limiting resistors can be created advantageously by adding a second layer of a fixed resistive material adjacent to the bistable resistive material forming the memory elements. For example, Lee, et al. (*Nature Materials* 10, 625-630, doi: 10.1038/nmat3070, 2011) describe ReRAM devices based on bilayers of material based on $Ta_2O_5$. A resistive layer (resistivity $10^7$-$10^8$ $\Omega cm$) is created using dc reactive ion sputtering of Ta metal in an $Ar/O_2$ atmosphere, where the $O_2$ level is adjusted to create a substoichiometric $TaO_{2.5-x}$ layer having sufficient oxygen deficit to provide permanent, but limited, conduction paths. Lee reports that a near-stoichiometric ($10^{13}$ $\Omega cm$) thin layer was created on top of the resistive layer by exposure to an oxygen plasma. This thin surface layer reportedly had the required bistable resistance to create memory elements. The total thickness of the oxide layers was 30-40 nm (300-400 Å) of which 10 nm (100 Å) was the near-stoichiometric top layer.

However, the relatively thick structures disclosed by Lee would limit the areal density of a ReRAM memory array based on the devices. Typically, such a layer can be patterned with features no smaller than the layer thickness. What is needed are methods of making similar and smaller structures comprising layers of transition metal oxides of variable composition with precise control over the composition and thickness of each layer.

SUMMARY OF THE INVENTION

Embodiments of the invention include nonvolatile memory elements and memory devices comprising the nonvolatile memory elements. The nonvolatile memory element comprises a first electrode layer, a second electrode layer, and a first oxide layer and second oxide layer disposed between the first and second electrode layers. The first oxide layer comprises $Me^1_w Me^2_x Si_y O_z$, where $Me^1$ and $Me^2$ are metals, $w \geq 0$, $x \geq 0$, $y \geq 0$, and $z > 0$, and at least one of w, x, and y is greater than zero, and the second oxide layer comprises $Me^1_a Me^2_b Si_c O_d$, where $a \geq 0$, $b \geq 0$, $c \geq 0$, and $d > 0$, and at least one of a, b, and c is greater than zero. One of the oxide layers has linear resistance and substoichiometric composition, and the other has bistable resistance and near-stoichiometric composition. In certain embodiments, the oxide layers can further comprise nitrogen, forming near-stoichiometric and/or substoichiometric oxynitride layers. Preferably, the sum of the two oxide layer thicknesses is between about 20 Å and about 100 Å, and the layer with bistable resistance has a thickness between about 25% and about 75% of the total thickness.

In some embodiments, methods of forming a plurality of layers are disclosed. The methods include forming a first layer on a substrate, wherein the first layer comprises $Me^1_w Me^2_x Si_y O_z$, where $Me^1$ and $Me^2$ are metals, $w \geq 0$, $x \geq 0$, $y \geq 0$, and $z > 0$, and at least one of w, x, and y is greater than zero; and forming a second layer on a substrate, wherein the second layer comprises $Me^1_a Me^2_b Si_c O_d$, where $a \geq 0$, $b \geq 0$, $c \geq 0$, and $d > 0$ and at least one of a, b, and c is greater than zero. In some embodiments, the layers are formed using reactive sputtering in an atmosphere with controlled amounts of argon and oxygen, and can optionally include nitrogen. In additional embodiments, the layers can be formed using atomic layer deposition (ALD) or chemical vapor deposition (CVD). At least two layers are deposited, where one layer has linear resistance and substoichiometric composition, and the other layer has bistable resistance and near-stoichiometric composition. The sum of the two layer thicknesses is between about 20 Å and about 100 Å, and the layer with bistable resistance has a thickness between 25% and 75% of the total thickness.

In yet further embodiments, methods are provided for forming a plurality of layers. The first layer can be formed using sputtering, wherein the first layer comprises $Me^1_w Me^2_x Si_y$, where $Me^1$ and $Me^2$ are metals, $w \geq 0$, $x \geq 0$, y≥0, and at least one of w, x, and y is greater than zero. The second layer can be formed above or below the first layer using reactive sputtering in an atmosphere comprising argon and oxygen, wherein the second layer comprises $Me^1_a Me^2_b Si_c O_d$, where a≥0, b≥0, c≥0, and d>0, and at least one of a, b, and c is greater than zero. The first layer is formed in the absence of a reactive gas such as $O_2$ or $N_2$, while the second layer is formed in the presence of a reactive gas. In certain embodiments, nitrogen can also be present in the second layer (e.g., by including nitrogen as a component of the reactive gas). The methods further comprise annealing the first and second layers such that oxygen atoms migrate from the second layer into the first layer. The annealed first layer has linear resistance and substoichiometric composition, and the annealed second layer has bistable resistance and near-stoichiometric composition. The layers can be formed in any order. Preferably, the sum of the two layer thicknesses is between about 20 Å and about 100 Å, and the second layer has a thickness between 25% and 75% of the total thickness.

The metal can be any transition metal or can be selected from tantalum, niobium, hafnium, yttrium, zirconium, lanthanum, vanadium, titanium, tungsten, nickel, or aluminum, or combinations thereof.

Memory devices can be made comprising arrays of nonvolatile memory elements where the first electrodes of each nonvolatile memory element are coplanar and arranged as a first set of parallel electrodes, and the second electrodes of each nonvolatile memory element are coplanar and arranged as a second set of parallel electrodes at an angle to the first set of parallel electrodes.

DETAILED DESCRIPTION

Figure 1:
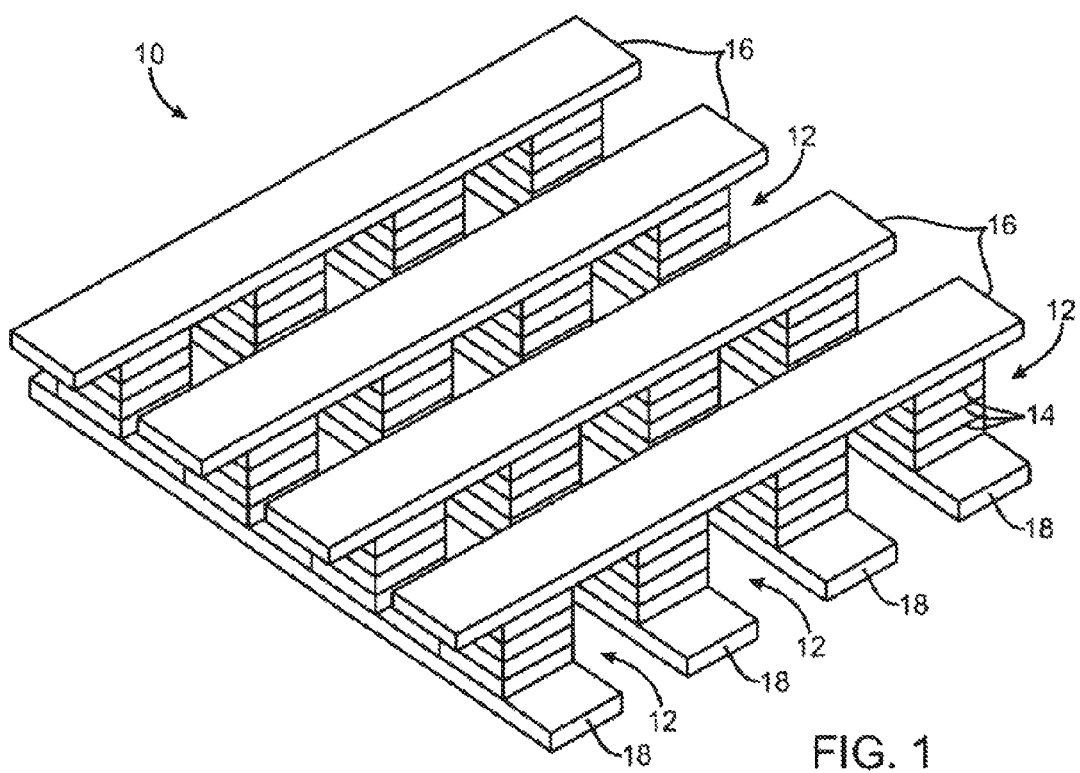
FIG. 1 shows a diagram of an illustrative array of resistive switching nonvolatile memory elements.

Before the present invention is described in detail, it is to be understood that unless otherwise indicated this invention is not limited to specific resistive switching layer or resistive layer compositions. Exemplary embodiments will be described for a plurality of layers comprising $Ta_2O_{5-\delta}$ (near stoichiometric, bistable resistance) layers and $TaO_{2.5-x}$ (substoichiometric, resistive) layers, but bilayers and multilayers comprising stoichiometric, near-stoichiometric, and substoichiometric oxides, nitrides, and oxynitrides of any metal can beneficially be produced using the methods disclosed herein. Most generally, the layers can comprise compounds of the form $Me^1_w Me^2_x Si_y O_z N_v$, where $Me^1$ and $Me^2$ are metals, v≥0, w≥0, x≥0, y≥0, and z>0, and at least one of w, x, and y is greater than zero. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" is used, the stated quantity may vary by ±10%.

DEFINITIONS

As used herein, the term "near-stoichiometric" refers to compounds where the atomic ratio deviates only slightly from the stoichiometrically correct ratio (wherein valence electrons are all balanced). For near-stoichiometric metal oxides described herein, there is typically a slight deficit of oxygen atoms relative to that of the fully oxidized metal, that deficit being sufficient to create defects in the lattice and a bistable resistance characteristic in sufficiently thin layers. For notational convenience, such near-stoichiometric oxides are abbreviated by adding a "−δ" after the number of oxygen atoms in an otherwise stoichiometric formula (e.g., $Ta_2O_{5-\delta}$). Much as with semiconductor doping, very small concentrations (<0.01%) of "defects" in the form of missing O atoms can be sufficient to create thin layers with bistable resistance. For example, δ<0.0005 for $Ta_2O_{5-\delta}$. (Many authors use $Ta_2O_{5-x}$ instead of $Ta_2O_{5-\delta}$; δ is used in lieu of x herein to help clarify whether a near-stoichiometric or substoichiometric oxide is meant.) These near-stoichiometric layers provide the resistive switching functionality of the resistive switching nonvolatile memory elements described herein.

As used herein, the term "substoichiometric" refers to compounds where the atomic ratio deviates substantially (more than 0.01%) from the stoichiometrically correct ratio.

For substoichiometric oxides described herein, there is a larger deficit of oxygen atoms (compared to near-stoichiometric oxides) sufficient to create continuous permanent strings of defects in the lattice and a linear resistance characteristic. For notational convenience, such oxides are abbreviated by adding a "-x" after the relative number of oxygen atoms in a formula where the count of metal atoms is taken to be 1 (e.g., $TaO_{2.5-x}$).

As used herein, the term "oxynitride" refers to embodiments of near-stoichiometric or substoichiometric oxides containing nitrogen, for example, $Ta_2O_{5-\delta}N_y$ or $TaO_{2.5-x}N_y$, respectively. The value of y is less than or equal to $\delta$ or x, typically somewhat less, although y can be adjusted independently of $\delta$ or x to achieve particular performance characteristics for the resultant layer.

As used herein the term "nitrogen-stabilized oxide" is a synonym of "oxynitride" reflecting the possibility that an oxide layer is "stabilized" by adding nitrogen atoms to replace a subset of the oxygen vacancies.

As used herein, the term "conductor" refers to a volume of material (such as a wire, thin film, or electrode) comprising a "conductive material." The material is said to be "conductive" if there is negligible voltage drop across the conductor at operating currents. In certain instances, a small voltage drop is acceptable, although typically the voltage drop across adjacent components is much larger.

Embodiments of the present invention relate to nonvolatile memory formed from resistive switching elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used as data storage devices in portable and non-portable computing machines as well as portable devices such as digital cameras, mobile telephones, handheld computers, vehicles, appliances, and music players. Nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Memory arrays formed of resistive switching memory elements are known as "resistive random access memory" or "ReRAM." In certain embodiments, the first electrodes of each nonvolatile memory element are coplanar and arranged as a first set of parallel electrodes, and the second electrodes of each nonvolatile memory element are coplanar and arranged as a second set of parallel electrodes at an angle to the first set of parallel electrodes.

An illustrative memory array 10 of resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory element 12 may be formed from one or more layers of materials, as indicated schematically by lines 14 in FIG. 1. In addition, the memory arrays shown can be stacked in a vertical fashion to make multi-layer 3-D memory arrays.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
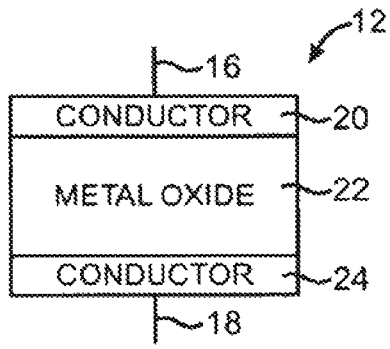
FIG. 2A is a cross-sectional view of an illustrative resistive switching nonvolatile memory element.

A cross-section of an illustrative embodiment of a resistive switching memory element is shown in FIG. 2A. In the example of FIG. 2A, memory element 12 (as shown in FIG. 1) is formed from a metal oxide memory layer 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from any suitable metals (e.g., tungsten, aluminum, copper, metal silicides, etc.). Conductive lines 16 and 18 may also be formed from other conductive materials (e.g., doped polysilicon, doped silicon, etc.), combinations of these materials, or any other suitable conductive material. If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., resistors, diodes, transistors, etc.) that are formed between line 16 and electrode 20 or between line 18 and electrode 24.

Figure 2B:
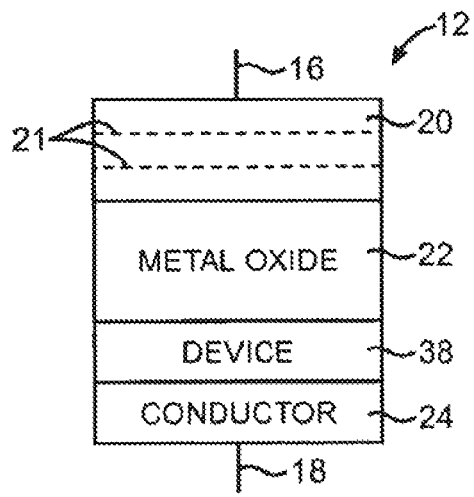
FIG. 2B is a cross-sectional view of an illustrative resistive switching nonvolatile memory element.

If desired, there may be an intervening electrical component between an electrode and resistive switching layer 22. An illustrative arrangement in which there is an intervening electrical component 38 between electrode 24 and metal oxide 22 is shown in FIG. 2B.

As indicated schematically by dotted lines 21, conductive materials such as electrodes 24 and 20 may be formed from one or more layers of materials. Examples of materials that may be used to form electrodes 20 and 24 include metal (e.g., refractory or transition metals), metal alloys, metal nitrides (e.g., refractory metal nitrides), metal silicon nitrides (i.e., materials containing refractory metals, transition metals, or other metals, along with silicon, and nitrogen), metal silicides, or other conductors. A titanium nitride layer or similar barrier layer under lower electrode 24 can be added to prevent metals and other doping and alloying elements from diffusing into an underlying silicon structure.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals across terminals 16 and 18.

Figure 3:
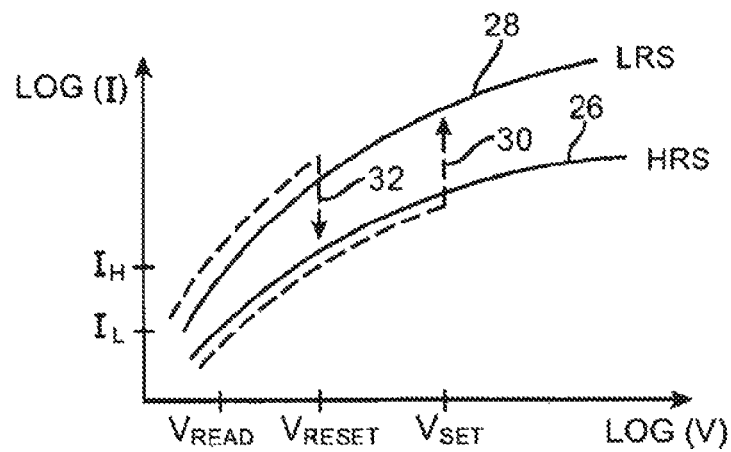
FIG. 3 shows a graph illustrating how a resistive switching nonvolatile memory element of the types shown in FIGS. 2A and 2B may exhibit bistable behavior.

A current (I) versus voltage (V) plot for memory element 12 is shown in FIG. 3. Initially, memory element 12 may be in a high resistance state (e.g., storing a logic one). In this state, the current versus voltage characteristic of memory element 12 is represented by solid line HRS 26. The high resistance state of memory element 12 can be sensed by read and write circuitry. For example, read and write circuitry may apply a read voltage $V_{read}$ to memory element 12 and can sense the resulting low current $I_L$ that flows through memory element 12. When it is desired to store a logic zero in memory element 12, memory element 12 can be placed into its low-resistance state. This may be accomplished by using read and write circuitry to apply a voltage $V_{set}$ across terminals 16 and 18 of memory element 12. Applying $V_{set}$ to memory element 12 causes memory element 12 to enter its low resistance state, as indicated by dotted line 30. In this region, the structure of memory element 12 is changed (e.g., through the formation of current filaments through memory layer 22 or other suitable mechanisms), so that, following removal of the voltage $V_{set}$, memory element 12 is characterized by low resistance curve LRS 28.

The low resistance state of memory element 12 can be sensed using read and write circuitry. When a read voltage $V_{read}$ is applied to resistive switching memory element 12, read and write circuitry will sense the relatively high current value $I_H$, indicating that memory element 12 is in its low resistance state. When it is desired to store a logic one in memory element 12, the memory element can once again be placed in its high resistance state by applying a voltage $V_{reset}$ to memory element 12. When read and write circuitry applies $V_{reset}$ to memory element 12, memory element 12 enters its high resistance state HRS, as indicated by dotted line 32. When the voltage $V_{reset}$ is removed from memory element 12, memory element 12 will once again be characterized by high resistance line HRS 26. Example 4 shows measurements on two different embodiments of resistive switching memory element 12. In the example, $V_{set}$ and $V_{reset}$ are in the range 1-4 V, and $V_{read}$ is is about 0.5 V.

The bistable resistance of resistive switching memory element 12 makes memory element 12 suitable for storing digital data. Because no changes take place in the stored data in the absence of application of the voltages $V_{set}$ and $V_{reset}$, memory formed from elements such as memory element 12 is non-volatile.

Any suitable read and write circuitry and array layout scheme may be used to construct a nonvolatile memory device from resistive switching memory elements such as memory element 12. For example, horizontal and vertical lines 16 and 18 may be connected directly to the terminals of resistive switching memory elements 12. This is merely illustrative. If desired, other electrical devices may be associated with each memory element 12.

Figure 4:
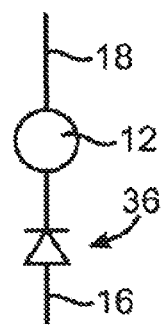
FIG. 4 is a schematic diagram of an illustrative resistive switching nonvolatile memory element in series with a diode.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
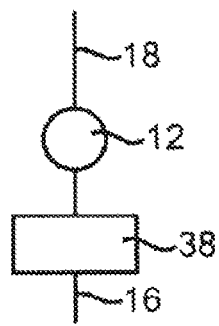
FIG. 5 is a schematic diagram of an illustrative resistive switching memory element in series with an electrical device.
Figure 6:
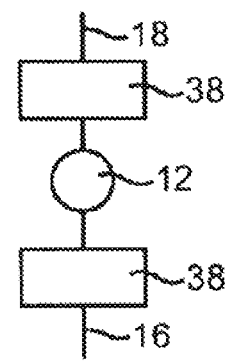
FIG. 6 is a schematic diagram of an illustrative resistive switching memory element in series with two electrical devices.

If desired, other electrical components can be formed in series with resistive switching memory element 12. As shown in FIG. 5, electrical device 38 may be placed in series with resistive switching memory element 12. Device 38 may be a resistor, a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12.

Memory elements 12 may be formed in a single layer in array 10 or may be formed in multiple layers. An advantage of forming memory arrays such as memory array 10 of FIG. 1 using a multi-layer memory element scheme is that this type of approach allows memory element density to be maximized.

If desired, a resistive switching metal oxide layer may be formed above or below a diode (as an example). Conductive lines 16 and 18 may be electrically coupled to metal oxide layer 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in memory element 12 may be formed from the same conductive material or different conductive materials. Moreover, conductive layers in memory element 12 may be formed using the same techniques or different techniques. As an example, one layer of a conductor may be formed using physical vapor deposition (PVD) techniques (e.g., sputter deposition), whereas another layer of a conductor may be formed using electrochemical deposition.

The portions of the conductive layers in memory element 12 that are immediately adjacent to metal oxide 22 or are otherwise in close association with metal oxide 22 are sometimes referred to as the electrodes of the resistive switching memory element 12.

In general, the electrodes of resistive switching memory element 12 may each include a single material (e.g., tantalum), may each include multiple materials (e.g., tantalum and titanium nitride), may include materials formed using different techniques (e.g., electrochemically deposited tantalum and PVD tantalum), or may include combinations of such materials.

Certain metal oxides are particularly appropriate for forming the resistive switching metal oxide layer 22. These metal oxides may include, for example, the transition metal oxides and mixtures thereof. In certain embodiments, oxides and oxynitrides of tantalum, niobium, hafnium, yttrium, zirconium, lanthanum, vanadium, titanium, tungsten, nickel, aluminum, and silicon, and combinations thereof can be used in forming the resistive switching metal oxide layer. In a preferred embodiment, tantalum oxide is used in forming the resistive switching metal oxide layer. Any suitable conductive materials may be used for forming the electrodes 20 and 24 of resistive switching memory element 12. Illustrative conductive materials include transition metals (and their nitrides), refractory metals (and their nitrides), and noble metals. Illustrative examples of conductive materials include Ti, Ta, W, Mo, Hf, Nb, Ni, Pd, Pt, Re, Ru, and Ir. Illustrative metal nitrides include titanium nitride, tantalum nitride, tungsten nitride, and molybdenum nitride. These are merely illustrative examples of materials that may be used for electrodes 20 and 24. Combinations of two or more of these materials (and/or their nitrides) metals may be used or other suitable conductive materials may be used as electrodes 20 and 24, if desired.

The electrodes 20 and 24 and other conductive layers that may be associated with memory element 12 may be formed using any suitable techniques. Illustrative conductive material fabrication techniques include physical vapor deposition (e.g., sputter deposition, evaporation), chemical vapor deposition, atomic layer deposition, and electrochemical deposition (e.g., electroless deposition, electroplating).

In accordance with one or more embodiments of the present invention, nonvolatile memory elements are provided. The nonvolatile memory elements comprise a first electrode layer, a second electrode layer, and a first oxide layer and second oxide layer disposed between the first and second electrode layers. The first oxide layer comprises $Me^1_w Me^2_x Si_y O_z$, where $Me^1$ and $Me^2$ are metals, $w \geq 0$, $x \geq 0$, $y \geq 0$, and $z > 0$, and at least one of w, x, and y is greater than zero, and the second oxide layer comprises $Me^1_a Me^2_b Si_c O_d$, where $a \geq 0$, $b \geq 0$, $c \geq 0$, and $d > 0$, and at least one of a, b, and c is greater than zero. One of the oxide layers has linear resistance and substoichiometric composition, and the other oxide layer has bistable resistance and near-stoichiometric composition. The oxide layers can further comprise nitrogen. Preferably, the sum of the two oxide layer thicknesses is between about 20 Å and about 100 Å, and the layer with bistable resistance has a thickness between about 25% and about 75% of the total thickness. In one embodiment, the first electrode layer comprises doped polycrystalline silicon and the second electrode layer comprises titanium nitride. In a particular embodiment, the layer with bistable resistance is adjacent to the first electrode layer. In another particular embodiment, the layer with bistable resistance is adjacent to the second electrode layer. Arrays of nonvolatile memory elements can be prepared to provide memory devices comprising the memory elements.

For example, the combination of a memory layer 22 and a fixed resistor 38 (FIG. 2B) can be formed as a bilayer. Exemplary embodiments of transition metal oxides herein generally comprise tantalum oxide, but other oxides and oxynitrides of transition metals such as niobium, hafnium, yttrium, zirconium, lanthanum, vanadium, titanium, tungsten, and nickel, as well as oxides and oxynitrides of aluminum and silicon, and combinations thereof can also be used. Each bilayer comprises one layer of near-stoichiometric composition having bistable resistance used as a memory layer and forming memory element 12 together with one layer of substoichiometric composition having linear resistance used as fixed resistor 38. The combined thickness of the layers is generally in the range 20-100 Å, and the relative thickness of the two layers can be between 1:3 and 3:1.

A preferred embodiment providing an attractive combination of performance characteristics and packaged memory density has a total layer thickness of 50-100 Å; the memory layer comprises one quarter of the total thickness. As can be seen in Example 4, such structures can be made with operating voltages and currents that are consistent with common semiconductor technologies. Furthermore, arrays of memory elements can readily be made using any available fabrication line widths. The memory elements require few layers, and the layers are generally thin compared to line widths. Devices that are competitive with any semiconductor or disk memory technology can be designed with fast access speeds and high memory capacity (e.g., >1 Tbyte).

Methods of Preparing Resistive Switching Nonvolatile Memory Elements

In accordance with one or more embodiments of the present invention, methods are provided of forming a plurality of layers to manufacture a resistive switching nonvolatile memory element. The method can comprise forming a first layer on a substrate, wherein the first layer comprises $Me^1_w Me^2_x Si_y O_z$, where $Me^1$ and $Me^2$ are metals, $w \geq 0$, $x \geq 0$, $y \geq 0$, and $z > 0$, and at least one of w, x, and y is greater than zero; and forming a second layer on a substrate, wherein the second layer comprises $Me^1_a Me^2_b Si_c O_d$, where $a \geq 0$, $b \geq 0$, $c \geq 0$, and $d > 0$ and at least one of a, b, and c is greater than zero. In some embodiments, the layers are formed using reactive sputtering in an atmosphere with controlled amounts of argon and oxygen. The sputtering atmosphere is performed at reduced pressure, such as between about 1 mTorr and about 5 mTorr. In additional embodiments, the layers can be formed using ALD or CVD. At least two layers are deposited, where one layer has linear resistance and substoichiometric composition, and the other layer has bistable resistance and near-stoichiometric composition. When prepared using sputtering, the oxygen concentration of the atmosphere used to form the layer having linear resistance is typically less than about 5 volume percent, while the oxygen concentration of the atmosphere used to form the layer having bistable resistance is typically more than about 30 volume percent. The sum of the two layer thicknesses is between about 20 Å and about 100 Å, and the layer with bistable resistance has a thickness between 25% and 75% of the total thickness.

In some embodiments, methods are provided for forming a plurality of layers. The first layer can be formed using sputtering, wherein the first layer comprises $Me^1_w Me^2_x Si_y$, where $Me^1$ and $Me^2$ are metals, $w \geq 0$, $x \geq 0$, $y \geq 0$, and at least one of w, x, and y is greater than zero. The second layer can be formed above or below the first layer using reactive sputtering in an atmosphere comprising argon and oxygen, wherein the second layer comprises $Me^1_a Me^2_b Si_c O_d$, where $a \geq 0$, $b \geq 0$, $c \geq 0$, and $d > 0$, and at least one of a, b, and c is greater than zero. The first layer is formed in the absence of a reactive gas such as $O_2$ or $N_2$, while the second layer is formed in the presence of a reactive gas. When prepared using sputtering, the oxygen concentration of the atmosphere used to form the second layer is typically more than about 30 volume percent. In certain embodiments, nitrogen can also be present in the second layer (e.g., by including nitrogen as a component of the reactive gas). The methods further comprise annealing the first and second layers such that oxygen atoms migrate from the second layer into the first layer. The subsequent annealing can cause some O (or N) migration into the pure metal layer to create a metal-rich oxide (or oxynitride). The annealed first layer has linear resistance and substoichiometric composition, and the annealed second layer has bistable resistance and near-stoichiometric composition. The layers can be formed in any order. Preferably, the sum of the two layer thicknesses is between about 20 Å and about 100 Å, and the second layer has a thickness between 25% and 75% of the total thickness.

In some embodiments, the metal is a transition metal, such as tantalum or niobium. In some embodiments, the metal is selected from the group consisting of tantalum, niobium, hafnium, yttrium, zirconium, lanthanum, vanadium, titanium, tungsten, nickel, aluminum, and combinations thereof. In preferred embodiments, the transition metal is tantalum provided by reactive sputtering (dc, ac, or rf) from a tantalum target. To form tantalum oxide species, the reactive sputtering is performed in an $Ar/O_2$ atmosphere. A typical pressure of the $Ar/O_2$ atmosphere is 1-5 mTorr.

In some embodiments, tantalum oxide layers of varying stoichiometry are formed by varying the oxygen concentration during the sputtering process. Tantalum most commonly has five valence electrons (5 $d^3$ 6 $s^2$), and $Ta_2O_5$ is the typical stable oxide. However, when the $O_2$ level in the sputtering chamber is insufficient to provide all of the oxygen atoms necessary to form $Ta_2O_5$, suboxides can be formed. Suboxides of tantalum are formed when the oxygen concentration is less than about 5%. Layers formed at 5% $O_2$ have mixed oxide composition and linear resistance. The oxygen concentration used to form near-stoichiometric $Ta_2O_{5-\delta}$ layers having bistable resistance is more than about 30%. Similar results were observed in niobium oxides as well using the same oxygen concentrations.

As will be seen in Example 1, X-ray Photoelectron Spectroscopy (XPS) shows that both $TaO_2$ and $TaO$ can be formed when the $O_2$ level is kept low Annealing (at least 1 min at at least 750 C in an $Ar/H_2$ atmosphere) can reduce or eliminate these suboxides as shown in Example 2. Substoichiometric tantalum oxide can also exist as $Ta_2O_5$ with interstitial Ta atoms present.

A typical array of nonvolatile memory elements assembled with crossed parallel electrodes requires individual steering elements such as p-i-n diodes for each memory element. The annealing process mentioned above (750 C for 1 min in $Ar/H_2$) is typically used to enable migration of dopant atoms in the steering elements. This annealing is typically performed after all device layers are formed. The substoichiometric and near-stoichiometric layers are protected from the above-mentioned changes in stoichiometry on annealing, because the production annealing occurs after the top electrode layer (e.g., TiN) is formed, and this top electrode layer protects the oxide layer from exposure to the $Ar/H_2$ atmosphere.

Typical operating conditions for the sputtering process comprise total pressures of 1-5 mTorr. If the $O_2$ concentration exceeds about 33%, the oxide approaches stoichiometric composition. At lower $O_2$ concentrations, increasing amounts of substoichiometric oxides can be formed in a well-controlled fashion as indicated in Examples 1 and 2. Example 3 shows the results of deep UV spectroscopic ellipsometry measurements of dielectric properties of these substoichiometric oxide layers which confirm the presence of metal rich material.

For very low $O_2$ concentrations, mixing with the Ar carrier gas can be inadequate, and nonuniform oxide formation can occur. In some embodiments of the present invention, these nonuniformities can be prevented by premixing $O_2$ and Ar and feeding the premix into the Ar carrier gas. Uniform substoichiometric oxides with higher metallic enrichment can be made in this manner.

In accordance with one or more embodiments of the present invention, further control over the properties of a near-stoichiometric or substoichiometric layer can be achieved by incorporating nitrogen into the layer. $N_2$ can be added to the $Ar/O_2$ gas mix to obtain oxynitrides such as $Ta_2O_{5-\delta}N_y$ or $TaO_{2.5-x}N_y$. The value of y is less than or equal to $\delta$ or x, typically somewhat less, although y can be adjusted independently of $\delta$ or x to achieve particular performance characteristics for the resultant layer. In these oxynitride layers, the presence of N atoms can stabilize the O vacancies and improve the endurance of switching and data retention time with lower transient switching currents. As such, these "oxynitrides" can also be described as "nitrogen stabilized oxides," and the two terms will be used interchangeably herein. Tantalum nitride is a good conductor with metallic conduction behavior (i.e., free electrons), and thus the addition of N atoms can stabilize the structure while still allowing conduction filaments to be created and destroyed. Nitrogen stabilization can, for example, enable the use of lower set and reset voltages and improve the number of set/reset cycles that can be reliably sustained in a layer with bistable resistance. With respect to sub-stoichiometric resistive layers, nitrogen atoms can stabilize the structure against changes in resistance due to oxygen vacancy migration and can be used to assist in tuning the resistivity of the layers.

In accordance with one or more embodiments of the present invention, similar metal or silicon oxide, nitride, and oxynitride layers can be formed using Atomic Layer Deposition (ALD) or Chemical Vapor Deposition (CVD). For example, tantalum oxides can be formed using pentakis(dimethylamino)tantalum as a tantalum precursor and ozone as a reactant gas to supply oxygen. In ALD, the layers can be formed by providing alternating pulses of the precursor gas and reactant gas to build sub-monolayer thicknesses per pulse. In CVD, both gases can be supplied simultaneously. Stoichiometric control can be implemented, for example, by controlling the temperature of the bubbler. (Typically, the pentakis(dimethylamino)tantalum precursor is supplied as a liquid through which a carrier gas such as $N_2$ is passed, and the temperature of the liquid determines the amount of precursor entrained.) The pulse (exposure) time can also be varied as can the choice of reactant gas. For example, $H_2O$ can be used instead of $O_3$ as a reactant gas for supplying oxygen in order to form more metal-rich layers.

In order to form layers with well-controlled resistivity, it is desirable to operate in a parameter space where the resistivity changes occur slowly with one or more process parameters. In some cases, commonly used ranges of process parameters fail to provide the required level of control. Alternate approaches can be helpful to provide process parameters such that the resistivity of layers can be well-controlled. Three methods are provided that can improve process control parameters for the formation of metal oxide (and oxynitride) layers by reactive sputtering.

Figure 7:
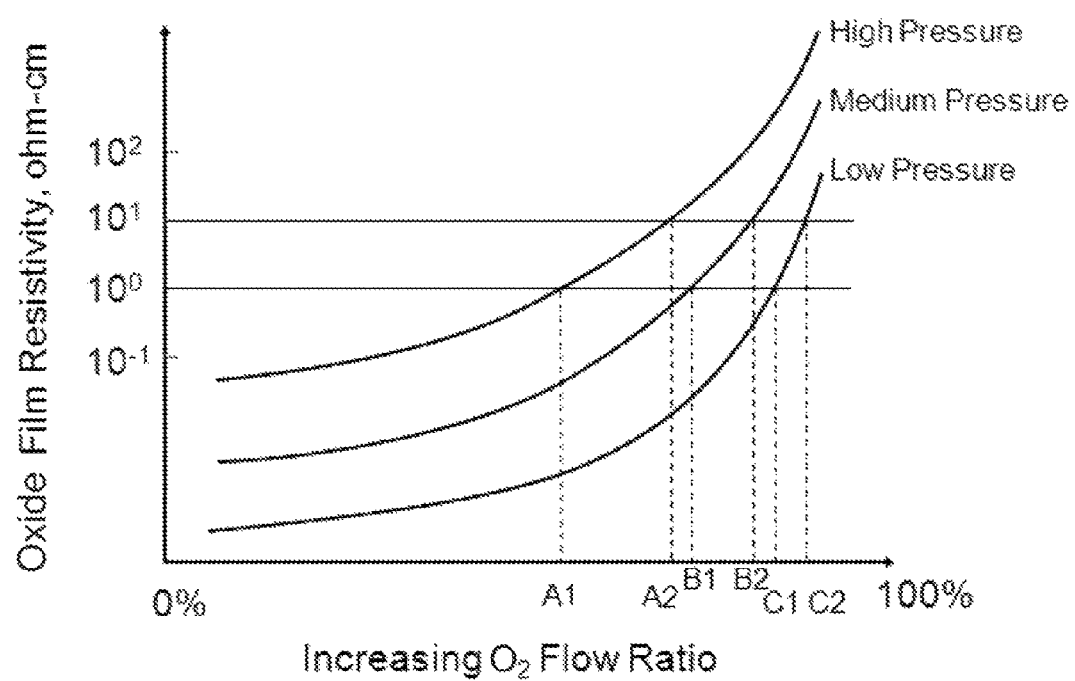
FIG. 7 shows simulated data for composition as a function of sputtering chamber pressure.

According to the first method, the pressure in the sputtering chamber is increased significantly from the normal operating point. Typically, to form a metal oxide using dc reactive sputtering, one uses an $Ar/O_2$ atmosphere at 1-5 mTorr. The oxygen content of the formed layer can be varied by varying the $O_2$ concentration in the $Ar/O_2$ atmosphere. The resulting layer resistivity is shown qualitatively in FIG. 7, where the "Low Pressure" curve corresponds roughly to typical operating conditions. (Data shown are simulations and do not represent real data for any particular metal oxide, sputtering power, or any particular operating pressure.) For the "Low Pressure" curve, resistivity is a steep function of the oxygen flow rate in a range C1-C2, and accurate control of resistivity would be very difficult. However, the curves shift and flatten with increasing pressure, and the useful control range broadens to B1-B2 at "Medium Pressure" and further to A1-A2 at "High Pressure." Exemplary pressures suitable for the higher operating pressures are in the range 10-50 mTorr.

Figure 8:
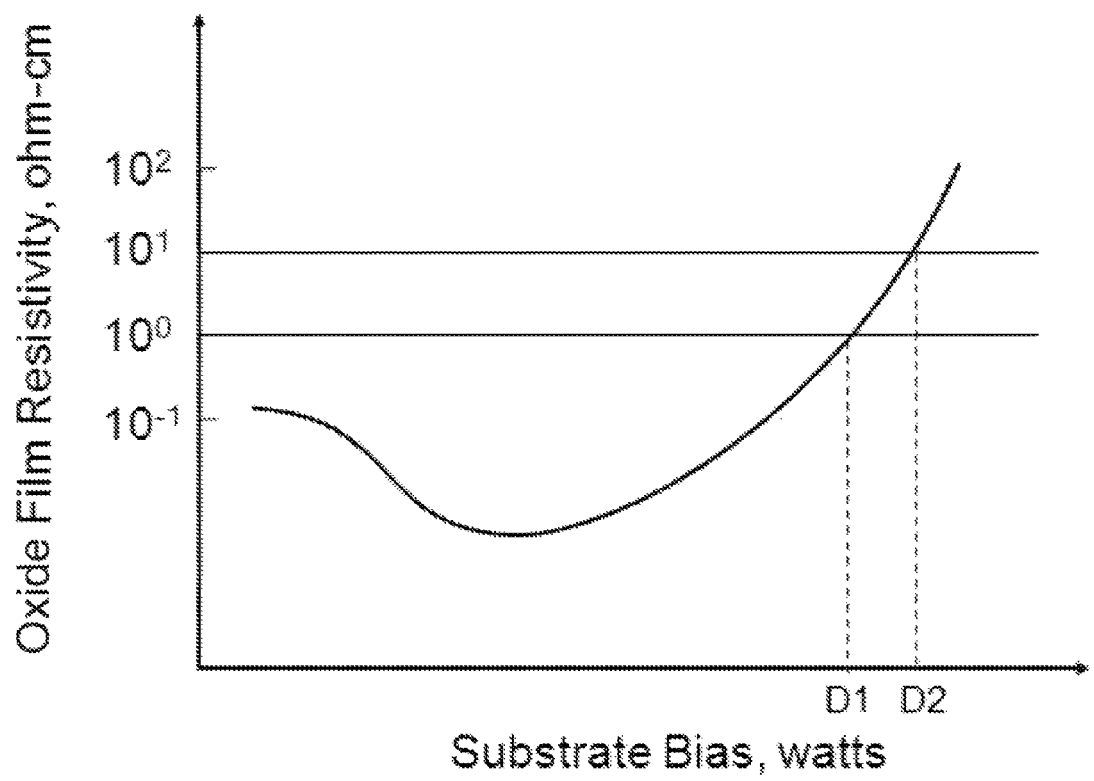
FIG. 8 shows simulated data for defect density as a function of sputtering chamber substrate bias voltage.

According to the second method, the substrate bias applied during sputtering is adjusted in an abnormal way. A typical (simulation) example of how oxide layer resistivity varies with substrate bias is shown in FIG. 8. In normal operation, the substrate bias is selected to maximize layer density through ion bombardment. Maximum layer density correlates with minimum resistivity. The layer density decreases to either side of this "optimum" substrate bias. In both directions, the resistivity in the layer increases. While there is a limit to the resistivity that can be achieved at low substrate bias, there is no such limit to the high side, and, in principle, arbitrary layer resistivity can be achieved. In practice, depending on other process parameters, the curve may become too steep in the target range, and this method can usefully be combined with the first and/or third methods to optimize process control.

Figure 9:
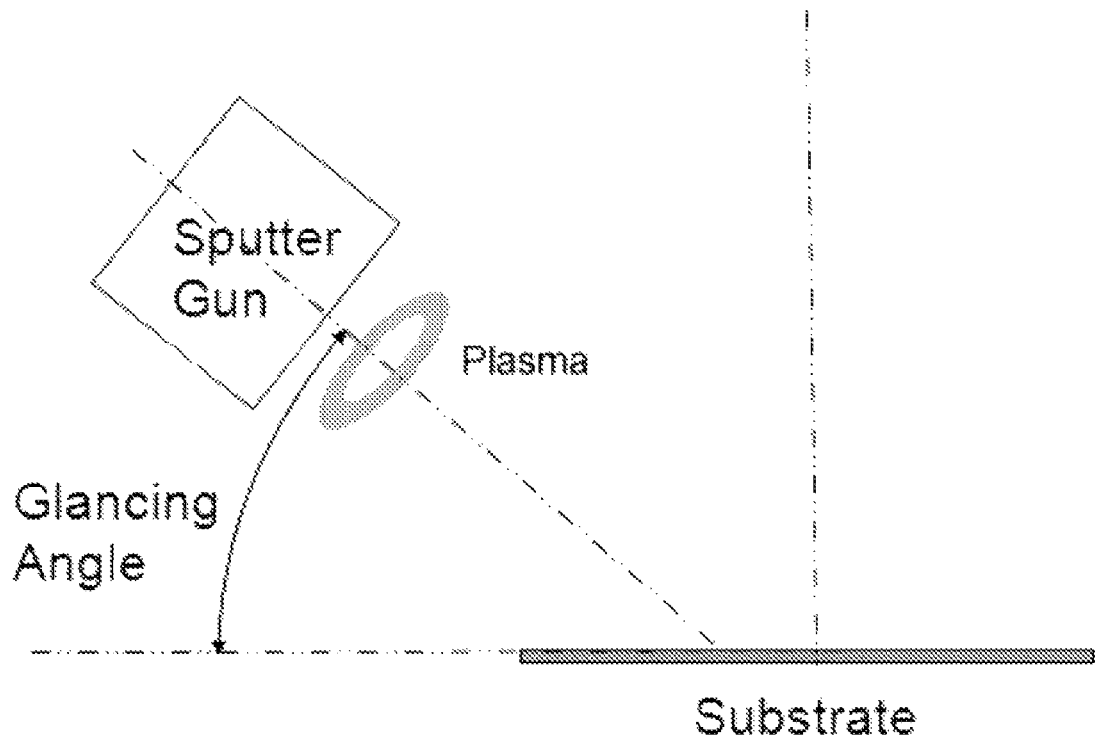
FIG. 9 shows sputtering at an oblique angle.
Figure 10:
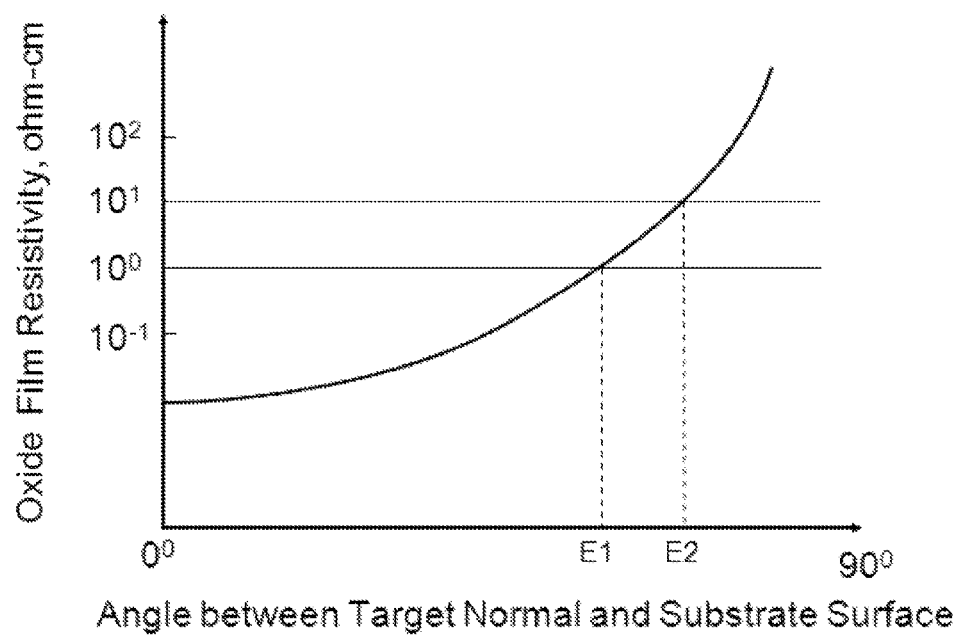
FIG. 10 shows simulated data for defect density as a function of sputtering angle.

According to the third method, as shown in FIG. 9, the sputter gun is positioned at an oblique angle, for example, greater than about 55° from the substrate normal (e.g., from about 55° to about 85°). The typical position of the sputter gun is directly overhead at 90° from the substrate plane. As shown qualitatively in FIG. 10, the reduced normal momentum from atoms incident at a glancing angle can also increase defect density and therefore resistivity to provide an additional control parameter.

In accordance with one or more embodiments of the present invention, bilayers and multilayers of varying composition and thickness can be created using any of the above-described methods for the deposition of each layer and adjusting the deposition time and/or sputtering conditions to obtain target layer thicknesses. Additional layers can be formed if desired.

EXAMPLES

Example 1

Sub-Oxide Compositional Analysis

Figure 11A:
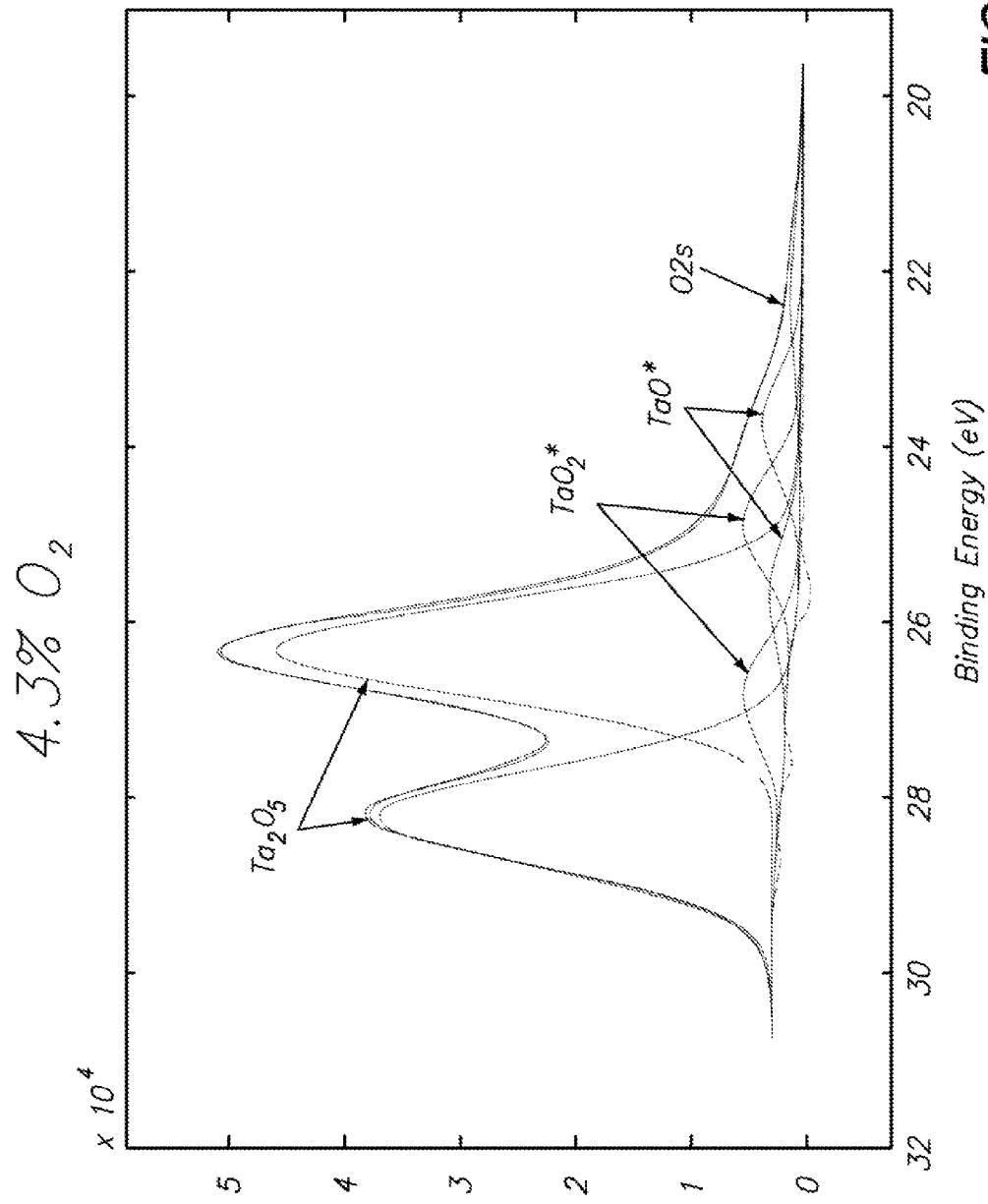
FIGS. 11A and B show X-ray photoelectron spectra of tantalum oxide layers made with low oxygen concentration in a dc reactive sputtering chamber.
Figure 11B:
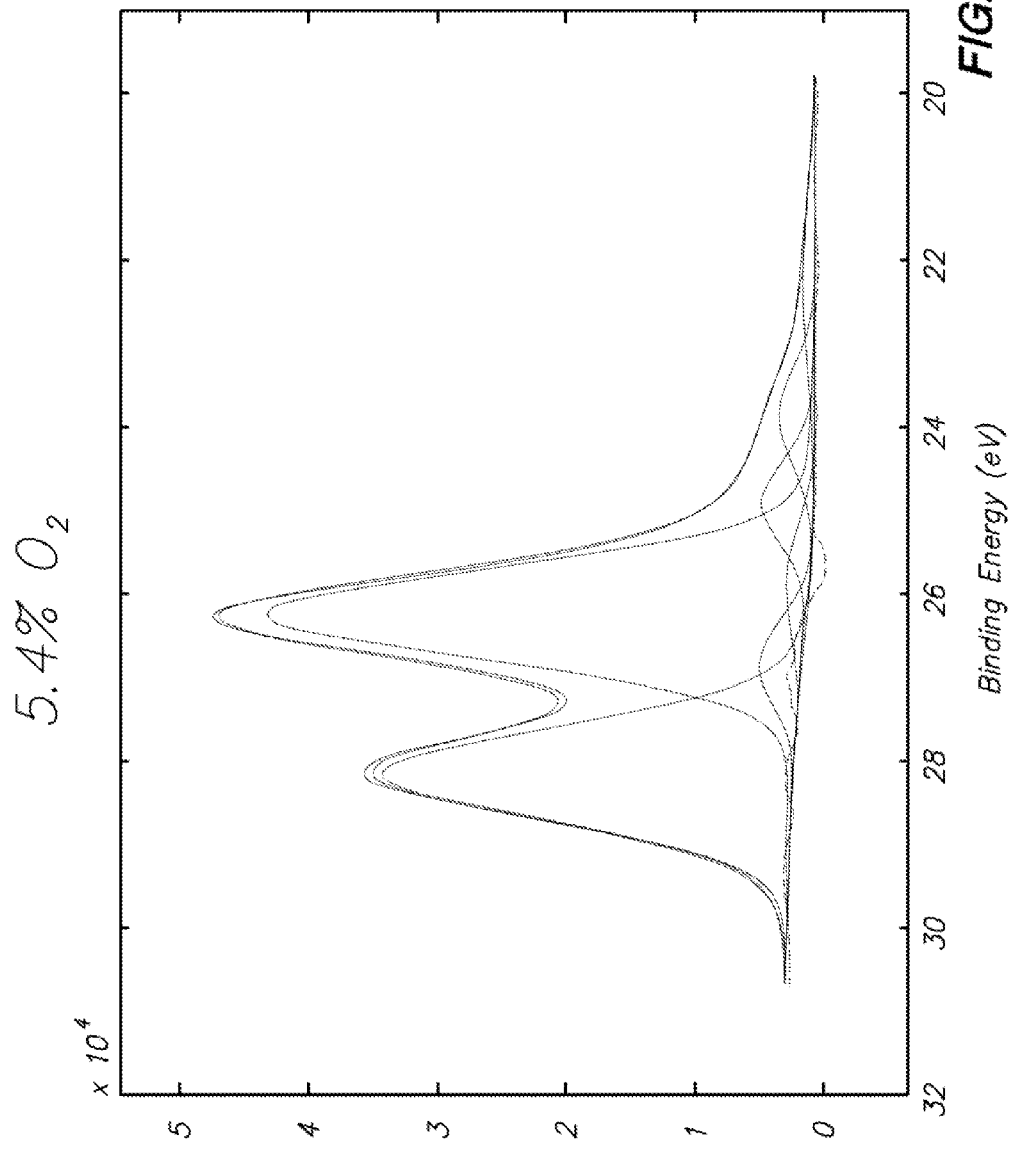

Tantalum oxide layers of varying composition were made by dc reactive sputtering in a locally built chamber as described above using either 4.3% or 5.4% $O_2$ in Ar (generally at 1-5 mTorr and 100-300 W). (All relative concentrations are set as volume flow rates such as standard cubic centimeters per minute [sccm].) These layers were expected to have substoichiometric composition. The layers were analyzed using XPS. The spectra of two samples are shown in FIGS. 11A and B, respectively, together with the peaks associated with a least-squares fit of possible constituents. The overall fit to the data is very good. Table 1 summarizes the compositional analysis:

TABLE 1

| % $O_2$ in Ar carrier gas | % $Ta_2O_5$ | % $TaO_2$ | % TaO |
|---|---|---|---|
| 4.3 | 83 | 10 | 7 |
| 5.4 | 86 | 8 | 6 |

The presence of $TaO_2$ and TaO sub-oxides was confirmed. It is also apparent that the amount of sub-oxide present in the deposited layer can be tuned by adjusting the $O_2$ concentration in the carrier gas.

Three additional samples were similarly prepared using oxygen concentrations of 10%, 33%, and 50%. These were analyzed by XPS, and the results are summarized in Table 2:

TABLE 2

| % $O_2$ in Ar carrier gas | % $Ta_2O_5$ |
|---|---|
| 10 | 93 |
| 33 | 100 |
| 50 | 100 |

For $O_2$ concentrations above about 33%, the oxide layers were found to be fully stoichiometric.

Example 2

Deep UV Spectral Ellipsometry Measurements

Figure 12:
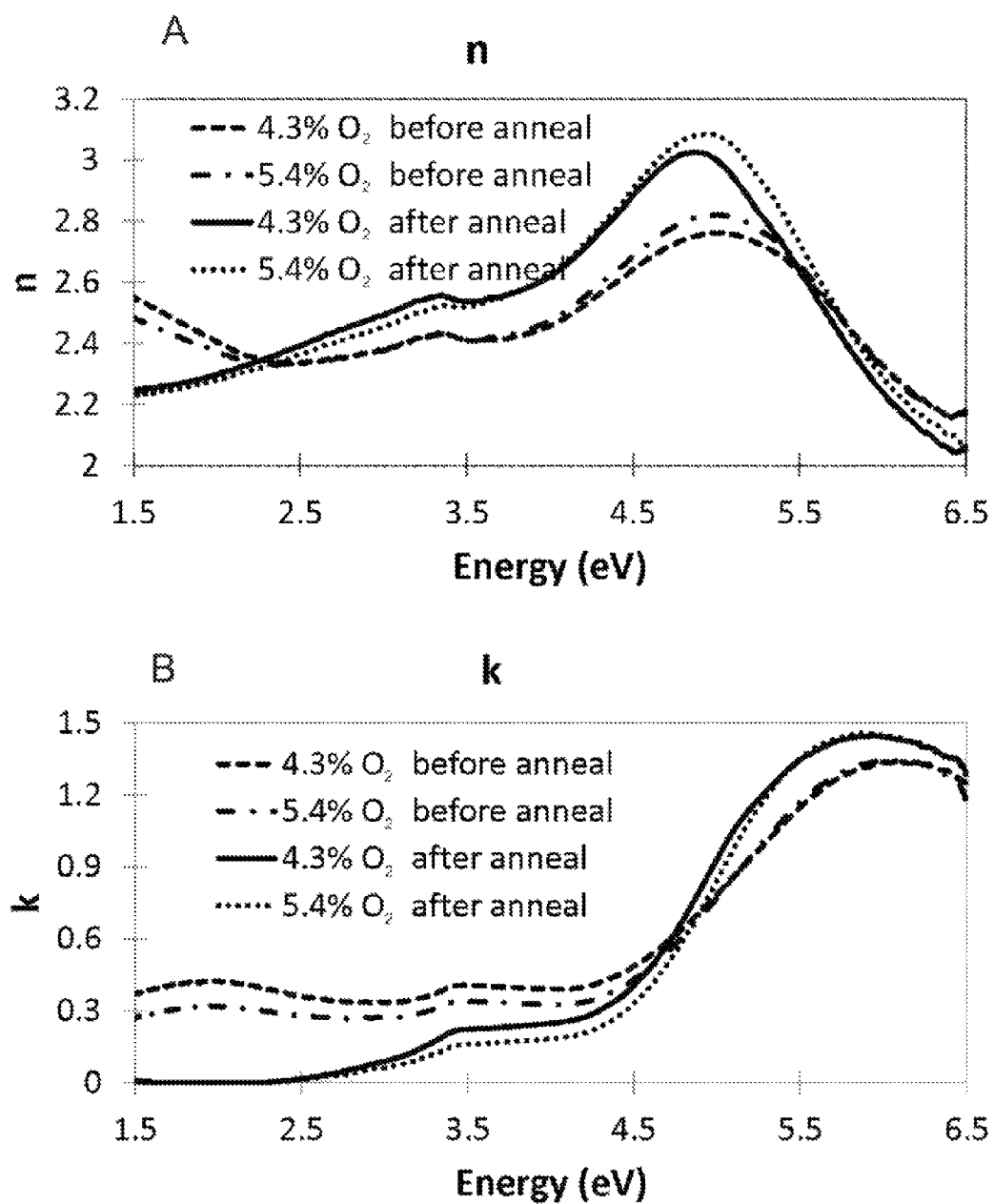
FIGS. 12A and B show deep UV spectroscopic ellipsometry measurements of tantalum oxide layers made with varying oxygen concentrations in a dc reactive sputtering chamber.
Figure 13A:
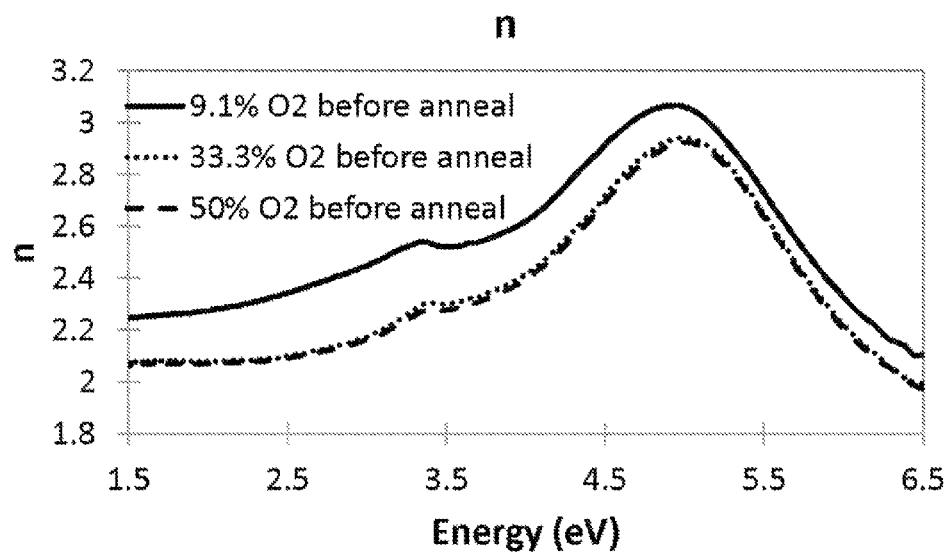
FIGS. 13A-D show deep UV spectroscopic ellipsometry measurements of tantalum oxide layers made with higher oxygen concentrations in a dc reactive sputtering chamber.
Figure 13B:
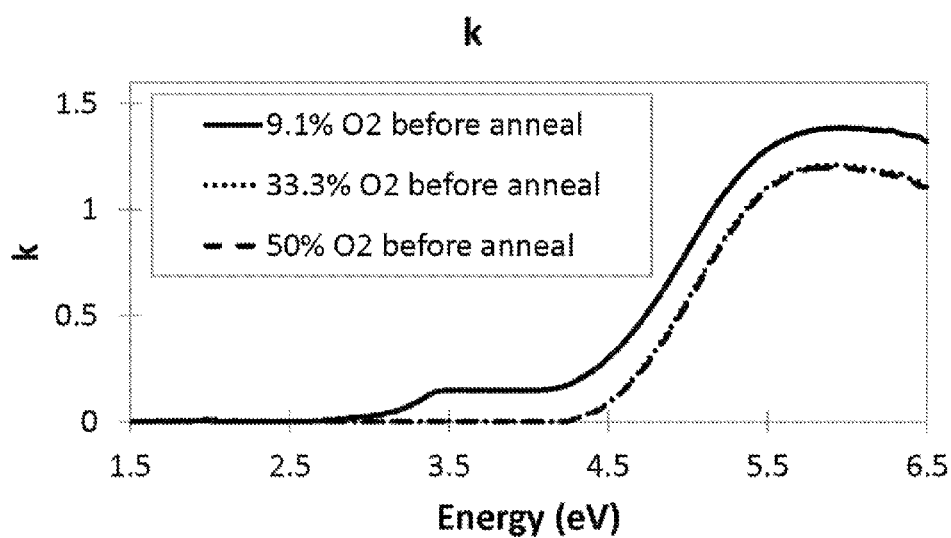
Figure 13C:
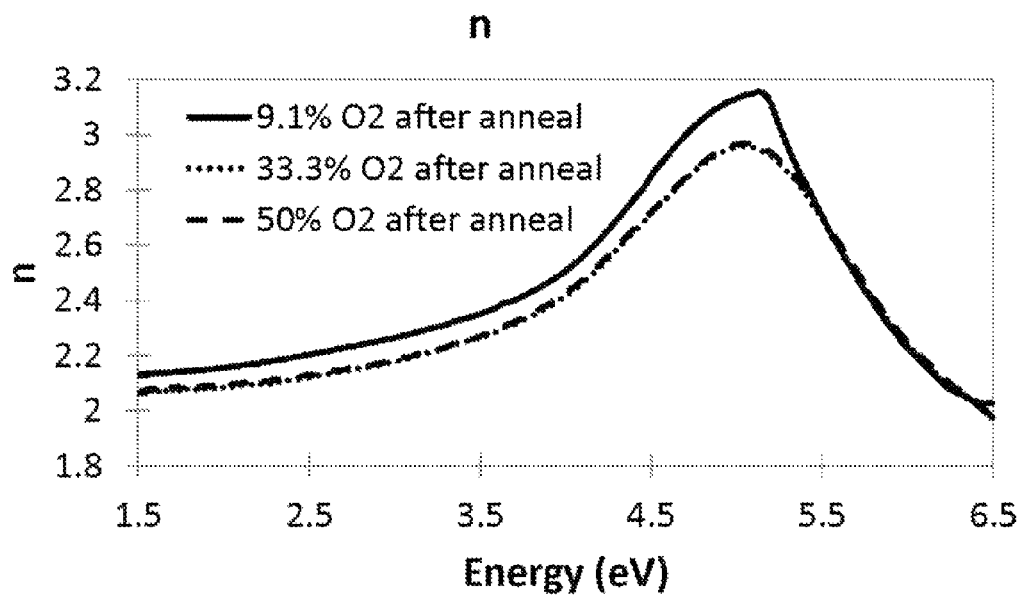
Figure 13D:
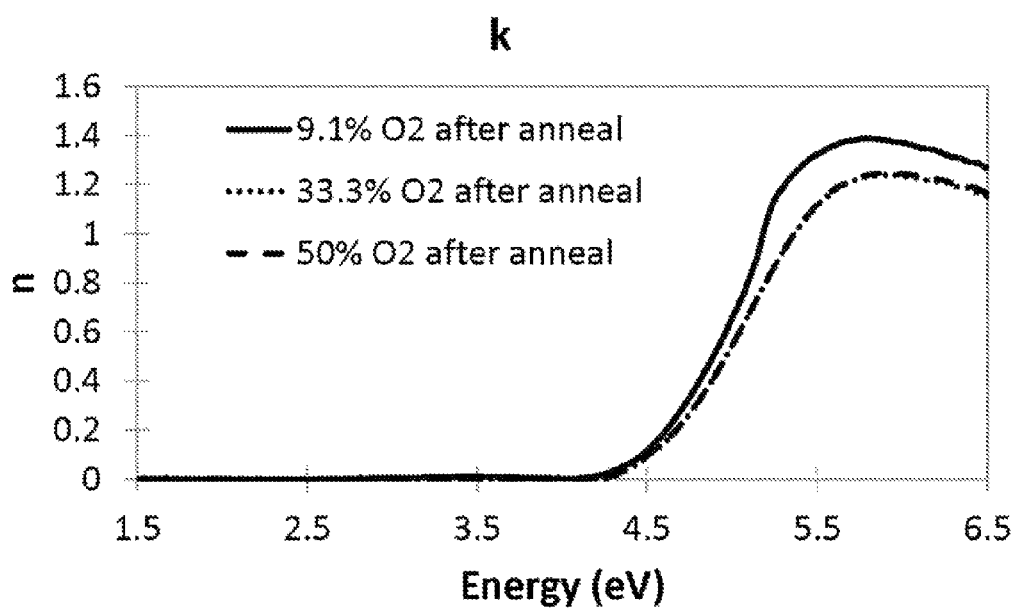

The samples described in Example 1 were further analyzed using deep UV spectral ellipsometry. Each sample was analyzed before and after annealing for 1 min at 750 C in an Ar/$H_2$ atmosphere. The results are shown in FIGS. 12A and B and 13A-D. 'n' and 'k' are the refractive index and extinction coefficient respectively.

As can be seen in the figures, the samples made with $O_2$ concentrations below 10% show significant absorption at lower energies, indicative of metallic or low band-gap sub-oxide phases. These are reduced but not eliminated after anneal. At higher $O_2$ concentrations these lower energy absorptions are absent.

Example 3

Deposition Rate

Figure 14:
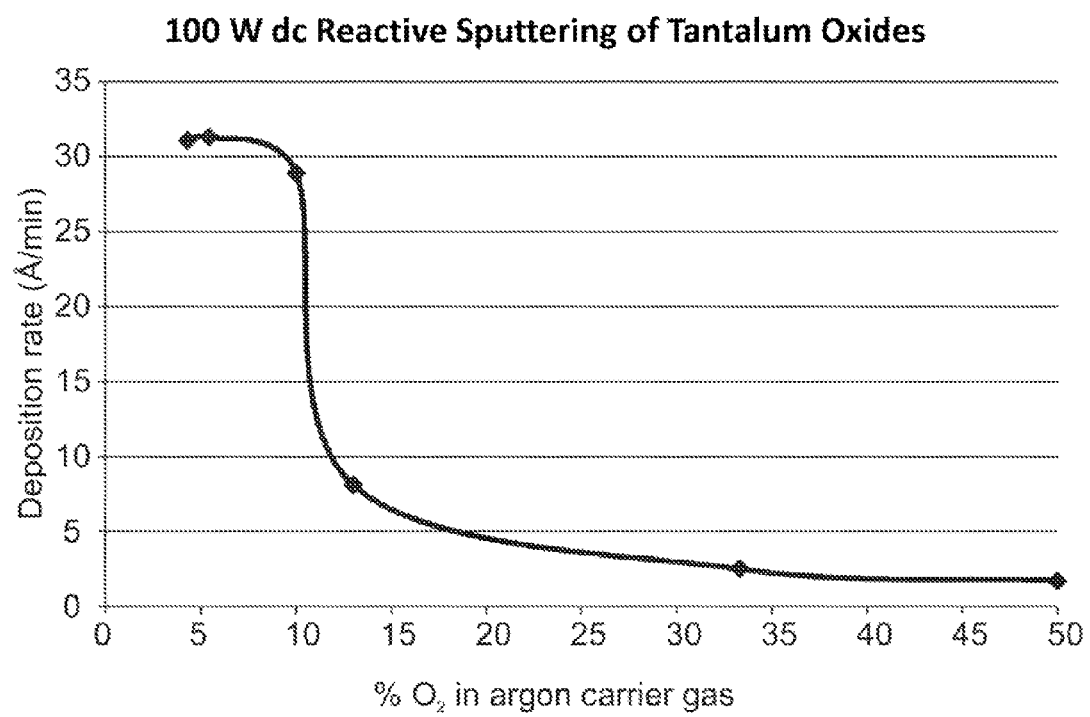
FIG. 14 shows tantalum oxide deposition rate as a function of $O_2$ concentration at 100 W power using dc reactive sputtering.

In order to controllably manufacture the very thin layers (several atomic thicknesses) required to make the near-stoichiometric $Ta_2O_{5-\delta}$ resistive switching layer, one must be able to provide a suitably slow deposition rate so that thickness can be controlled by process time. FIG. 14 shows that such control is indeed possible. The data are for 100 W power in a dc reactive sputtering process as a function of the $O_2$ concentration in the Ar/$O_2$ atmosphere. While the deposition rate for the lower $O_2$ concentrations is significantly higher than for higher concentrations, all rates are acceptably low to allow precise thickness control.

Example 4

ReRAM Structures

A series of bilayer structures were deposited between a base conductor of positively doped polysilicon and top conductor of TiN. Standard semiconductor fabrication methods were used to create a variety of test samples on a wafer. Layers were formed using Atomic Layer Deposition (ALD) and Physical Vapor Deposition (PVD—e.g., reactive sputtering). Electrodes and other patterned structures were created as needed by photolithography and dry etching. Each wafer was cleaved into "coupons" with 2-4 "dies" each. Varying thicknesses of a substoichiometric $TaO_{2.5-x}$ layer (formed at 4% $O_2$ concentration) and a near-stoichiometric $Ta_2O_{5-\delta}$ layer (formed at 50% $O_2$ concentrations) were tested, where the combined thickness of the oxide layers was 20-100 Å, and the relative thickness of the two layers was approximately 1:3, 1:1, or 3:1. A preferred embodiment providing an attractive combination of performance characteristics and packaged memory density was found to be one where the total oxide thickness was 50-100 Å, and the near-stoichiometric (bistable resistance) layer thickness was about 25% of the total. Sample electrical measurements on samples with 75 Å of a $TaO_{2.5-x}$ resistor layer and 25 Å of a $Ta_2O_{5-\delta}$ bistable memory layer are shown in Table 3. Results are shown for both memory layer on the top and memory layer on the bottom. Median values are shown. The overall yield of testable bilayer structures was 100%.

TABLE 3

| Parameter | Memory Layer on Top | Memory Layer on Bottom |
|---|---|---|
| $V_{forming}$ | 4.88 V | 6.15 V |
| $V_{set}$ | 2.23 V | 3.70 V |
| $I_{set}$ | 51 µA | 131 µA |
| $V_{reset}$ | -1.25 V | -1.19 V |
| $I_{reset}$ | -210 µA | -230 µA |

$V_{forming}$ is the voltage required to form a conductive filament for the first time through the memory layer. Thereafter, $V_{reset}$ and $V_{set}$ are the voltages required to break and reform the filaments during normal memory use measured across the near-stoichiometric memory layer. (Real circuits would have additional voltage drop across other resistances). The state of the memory layer can be read with a voltage of about 0.5 V. Note that there is a particularly significant difference between the set currents for the two geometries. There is also a marked difference between the forming voltages. Both show that the memory-layer-on-top arrangement is advantageous from a device performance point of view. The only asymmetry that makes the two geometries functionally different is the different materials used for the top and bottom electrodes. The lower set current required for the memory-layer-on-top arrangement provides evidence that the enablement of migration of oxygen vacancies in and out of an adjacent TiN layer is advantageous.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A nonvolatile memory element comprising:
a first layer operable as a first electrode;
a second layer operable as a second electrode;
a third layer comprising $Me^1_w Me^2_x Si_y O_z$ between the first layer and the second layer; and
a fourth layer comprising $Me^1_a Me^2_b Si_c O_d$ between the first layer and the second layer;
wherein $Me^1$ and $Me^2$ are metals;
wherein $w \geq 0$, $x \geq 0$, $y \geq 0$, $z > 0$, $a \geq 0$, $b \geq 0$, $c \geq 0$, and $d > 0$;
wherein at least one of w, x, or y>0;
wherein at least one of a, b, or c>0;
wherein one of the third layer or the fourth layer has a linear resistance and a substoichiometric composition; and
wherein another one of the third layer or the fourth layer has a bistable resistance and a near-stoichiometric composition.

2. The nonvolatile memory element of claim 1, wherein one of the third layer or the fourth layer comprises nitrogen.

3. The nonvolatile memory element of claim 1, wherein the third layer and the fourth layer comprise nitrogen.

4. The nonvolatile memory element of claim 1, wherein the one of the third layer or the fourth layer having the substoichiometric composition comprises $Ta_2O_{5-\delta}$, and wherein $\delta$ is less than 0.0005.

5. The nonvolatile memory element of claim 1, wherein one of the third layer or the fourth layer comprises tantalum oxide.

6. The nonvolatile memory element of claim 1, wherein the third layer and the fourth layer comprise tantalum oxide.

7. The nonvolatile memory element of claim 1, wherein one of the third layer or the fourth layer comprises tantalum oxynitride.

8. The nonvolatile memory element of claim 1, wherein the third layer and the fourth layer comprise tantalum oxynitride.

9. The nonvolatile memory element of claim 1, wherein one of the third layer or the fourth layer comprises one of tantalum, niobium, hafnium, yttrium, zirconium, lanthanum, vanadium, titanium, tungsten, nickel, aluminum, silicon, or combinations thereof.

10. The nonvolatile memory element of claim 1, wherein one of the third layer or the fourth layer comprises one of aluminum oxide, aluminum oxynitride, silicon oxide, or silicon oxynitride.

11. The nonvolatile memory element of claim 1, wherein the first layer comprises doped polysilicon; and wherein the one of the third layer and the fourth layer having the bistable resistance is adjacent to the first layer.

12. The nonvolatile memory element of claim 11, wherein the second layer comprises titanium nitride; and wherein the one of the third layer and the fourth layer having the linear resistance is adjacent to the second layer.

13. The nonvolatile memory element of claim 1, wherein the second layer comprises titanium nitride; and wherein the one of the third layer and the fourth layer having the linear resistance is adjacent to the second layer.

14. The nonvolatile memory element of claim 1, wherein a combined thickness of the third layer and the fourth layer is between about 20 Å and about 100 Å.

15. The nonvolatile memory element of claim 1, wherein the one of the third layer and the fourth layer having the bistable resistance has a thickness of between about 25% and about 75% of a combined thickness of the third layer and the fourth layer.

16. The nonvolatile memory element of claim 1, wherein the one of the third layer and the fourth layer having the bistable resistance has a thickness of about 25% of a combined thickness of the third layer and the fourth layer.

17. The nonvolatile memory element of claim 1, wherein w and x are greater than zero.

18. The nonvolatile memory element of claim 1, wherein a and b are greater than zero.

19. A nonvolatile memory element comprising:
a first layer operable as a first electrode;
a second layer operable as a second electrode;
a third layer having a bistable resistance; and
a fourth layer having a linear resistance;
wherein the first layer comprises titanium nitride;
wherein the second layer comprises doped polysilicon;
wherein the third layer comprises near-stoichiometric tantalum oxide;
wherein the fourth layer comprises sub-stoichiometric tantalum oxide;
wherein the third layer is disposed between the first layer and the fourth layer; and
wherein the fourth layer is disposed between the third layer and the second layer.

20. A method of forming a nonvolatile memory element, the method comprising:
forming a first layer on a substrate; and
forming a second layer on the first layer;
wherein the first layer comprises $Me^1_w Me^2_x Si_y O_z$;
wherein the second layer comprises $Me^1_a Me^2_b Si_c O_d$;
wherein $Me^1$ and $Me^2$ are metals;
wherein $w \geq 0$, $x \geq 0$, $y \geq 0$, $z > 0$, $a \geq 0$, $b \geq 0$, $c \geq 0$, and $d > 0$;
wherein at least one of w, x, or y is greater than zero;
wherein at least one of a, b, and c is greater than zero;
wherein one of the first layer or the second layer has a linear resistance and a substoichiometric composition; and
wherein another one of the first layer and the second layer has a bistable resistance and a near-stoichiometric composition.

* * * * *